(12) United States Patent
Hsieh

(10) Patent No.: US 8,217,721 B1
(45) Date of Patent: Jul. 10, 2012

(54) SLEW RATE ENHANCING CIRCUIT

(75) Inventor: Zong-Fu Hsieh, Tainan County (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 13/039,185

(22) Filed: Mar. 2, 2011

(51) Int. Cl.
*H03F 3/45* (2006.01)

(52) U.S. Cl. ........................................ 330/255; 330/257

(58) Field of Classification Search .................. 330/255, 330/257, 261
See application file for complete search history.

(56) References Cited

U.S. PATENT DOCUMENTS

| | | | |
|---|---|---|---|
| 5,801,564 A * | 9/1998 | Gasparik | 327/170 |
| 7,057,463 B2 * | 6/2006 | Wakii et al. | 330/295 |
| 7,250,819 B2 * | 7/2007 | Kelly et al. | 330/257 |
| 7,508,265 B2 * | 3/2009 | Lin | 330/255 |
| 7,859,505 B2 * | 12/2010 | An | 345/99 |
| 7,907,011 B2 * | 3/2011 | Chung | 330/255 |

\* cited by examiner

*Primary Examiner* — Henry Choe
(74) *Attorney, Agent, or Firm* — Stout, Uxa, Buyan & Mullins, LLP

(57) ABSTRACT

A slew rate enhancing circuit is disclosed. A current mirror circuit generates a mirrored current according to a current source, and the mirrored current is adaptively provided for an amplifier. A switch circuit is electrically coupled with the current source and the current mirror circuit. The switch circuit includes a first branch and a second branch that are coupled in parallel, wherein passage of the first branch and passage of the second branch are respectively controlled by a first switch and a second switch according to the non-inverting input voltage and the inverting input voltage.

14 Claims, 3 Drawing Sheets

SLEW RATE ENHANCING CIRCUIT

BACKGROUND OF THE INVENTION

1. Field of the Invention

The present invention generally relates to a slew rate enhancing circuit, and more particularly to a slew rate enhancing circuit for an operational amplifier.

2. Description of Related Art

An operational amplifier (OPA) is one type of differential amplifier that is one of the widely used electronic circuits for constructing a variety of modern electronic systems. It is common to use Miller capacitors for frequency compensation in the OPA to improve the stability of the OPA. However, the Miller capacitor with large capacitance disadvantageously degrades the slew rate of the OPA, and therefore restricts the operating speed of the OPA. Accordingly, tradeoff should be confronted between the stability and slew rate when designing the OPA.

For the reason that conventional OPAs are either limited by the low slew rate or unstable, a need has arisen to propose a novel slew rate enhancing circuit for improving operating speed of an amplifier by boosting its slew rate without degrading its stability.

SUMMARY OF THE INVENTION

In view of the foregoing, it is an object of the embodiment of the present invention to provide a slew rate enhancing circuit for increasing the slew rate of an amplifier without sacrificing its stability.

According to one embodiment, a slew rate enhancing circuit includes a current source, a current mirror circuit, and a switch circuit. The current source is configured to source or sink a current. The current mirror circuit is configured to generate a mirrored current according to the current source, and the mirrored current is then adaptively provided for an amplifier that is coupled to receive a non-inverting input voltage and an inverting input voltage. The switch circuit is electrically coupled with the current source and the current mirror circuit. The switch circuit includes a first branch and a second branch that are coupled in parallel, wherein passage of the first branch and passage of the second branch are respectively controlled by a first switch and a second switch according to the non-inverting input voltage and the inverting input voltage.

DETAILED DESCRIPTION OF THE INVENTION

Figure 1:
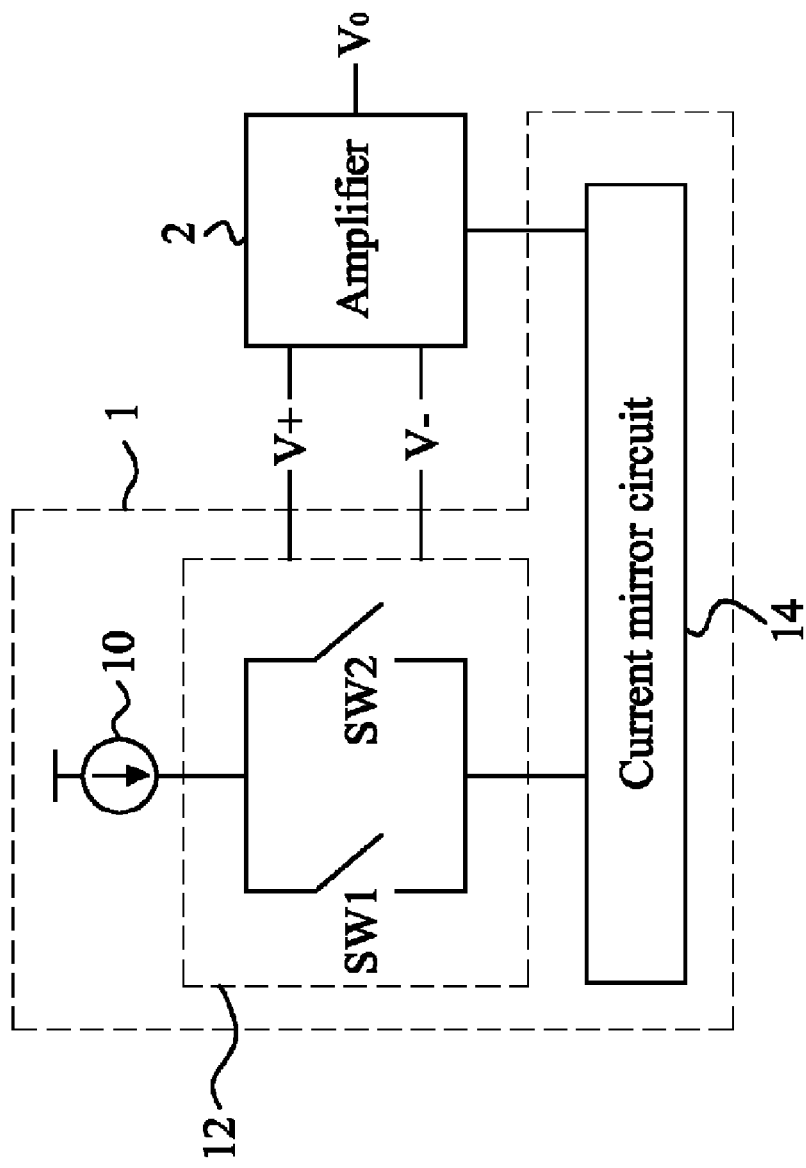
FIG. 1 shows a block diagram of a slew rate enhancing circuit according to one embodiment of the present invention.

FIG. 1 shows a block diagram of a slew rate enhancing circuit 1 according to one embodiment of the present invention. The slew rate enhancing circuit 1 is used, in the present embodiment, to increase the slew rate of an amplifier 2 such as, but not limited to, an operational amplifier (OPA). The amplifier 2 receives a pair of differential input voltages, i.e., a non-inverting input voltage V+ and an inverting input voltage V−, and accordingly generates an output voltage $V_o$. The amplifier 2 may, but not necessarily, include at least one Miller capacitor that is used for frequency compensation in the amplifier 2.

In the embodiment, the slew rate enhancing circuit 1 includes a current source 10, a switch circuit 12, and a current mirror circuit 14. Specifically, the switch circuit 12 is electrically coupled with the current source 10 and the current mirror circuit 14. For example, the switch circuit 12 is electrically coupled between the current source 10 and the current mirror circuit 14. The current source 10 is configured to source or sink a current. The switch circuit 12 includes two parallel branches—a first branch and a second branch—that are electrically coupled between the current source 10 and the current mirror circuit 14, and the passages of the two branches are respectively controlled by a first switch SW1 and a second switch SW2. The first switch SW1 is closed when a voltage difference between the non-inverting input voltage V+ and the inverting input voltage V−, i.e., (V+)−(V−), is greater than a first predetermined value; otherwise, the first switch SW1 is opened. The second switch SW2 is closed when a reverse voltage difference between the non-inverting input voltage V+ and the inverting input voltage V−, i.e., (V−)−(V+), is greater than a second predetermined value; otherwise, the second switch SW2 is opened. It is noted that the first predetermined value and the second predetermined value may unnecessarily be the same. When any of the branches is closed, the current mirror circuit 14 generates a mirrored current, based on the current source 10, for the amplifier 2. The mirrored current may be the same as the current of the current source 10, or may have a proper ratio to the current of the current source 10.

According to the embodiment, the slew rate enhancing circuit adaptively provides an additional current, i.e., the mirrored current, for the amplifier 2 when the voltage difference between the non-inverting input voltage V+ and the inverting input voltage V− is in a changing state such as a rising edge or a falling edge. As the slew rate is proportional to the current flowing through the amplifier 2, the slew rate can thus be increased due to the additional current when the voltage difference is in a changing state. On the other hand, when the voltage difference is in a steady state, the slew rate enhancing circuit 1 stops providing the additional current for the amplifier 2, thereby retaining stability of the amplifier 2.

Figure 2:
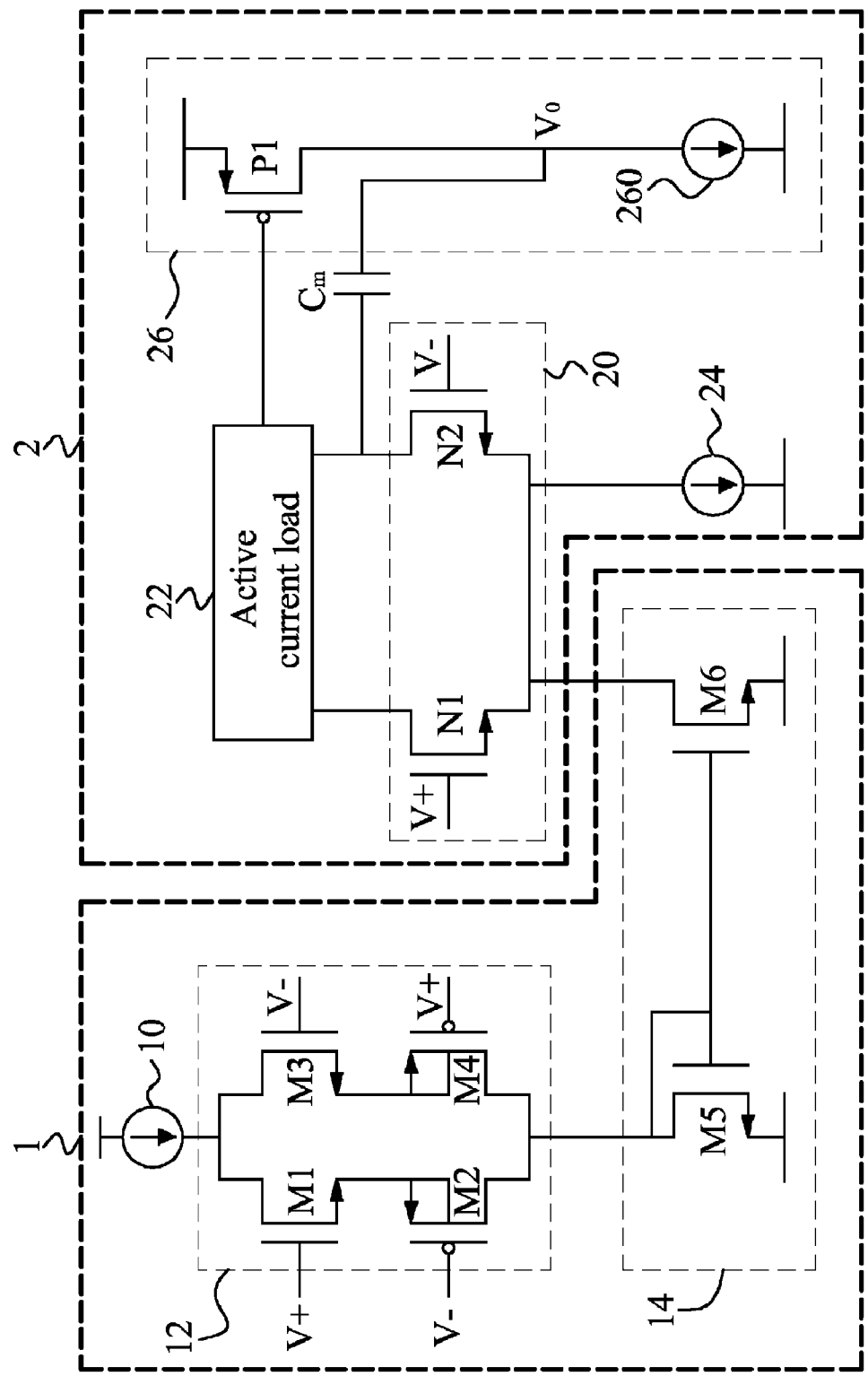
FIG. 2 shows a detailed circuit of the slew rate enhancing circuit of FIG. 1 according to the embodiment of the present invention.

FIG. 2 shows a detailed circuit of the slew rate enhancing circuit 1 of FIG. 1 according to the embodiment of the present invention. The amplifier 2 includes, in the embodiment, a differential pair 20, which is electrically coupled between an active current load 22 and a current source 24. The differential pair 20 includes two N-type metal-oxide-semiconductor (NMOS) transistors N1 and N2, which respectively receive the non-inverting input voltage V+ and the inverting input voltage V−. The amplifier 2 also includes an output stage 26, which includes a P-type metal-oxide-semiconductor (PMOS) transistor P1 and a current source 260 connected in series. Between the PMOS transistor P1 and the current source 260 is an output node $V_o$. A capacitor denoted as $C_m$ is the Miller capacitor.

The first branch in the switch circuit 12 includes series-connected NMOS first transistor M1 and PMOS second transistor M2. The source of the NMOS first transistor M1 is connected to the source of the PMOS second transistor M2. The drain of the NMOS first transistor M1 is connected to the current source 10, and the drain of the PMOS second transistor M2 is connected to the current mirror circuit 14. The gate of the NMOS first transistor M1 is coupled to receive the non-inverting input voltage V+, and the gate of the PMOS second transistor M2 is coupled to receive the inverting input voltage V−.

Similarly, the second branch in the switch circuit 12 includes series-connected NMOS third transistor M3 and PMOS fourth transistor M4. The source of the NMOS third transistor M3 is connected to the source of the PMOS fourth transistor M4. The drain of the NMOS third transistor M3 is connected to the current source 10, and the drain of the PMOS fourth transistor M4 is connected to the current mirror circuit 14. The gate of the NMOS third transistor M3 is coupled to receive the inverting input voltage V−, and the gate of the PMOS fourth transistor M4 is coupled to receive the non-inverting input voltage V+.

Specifically speaking, regarding the first branch, the NMOS first transistor M1 and the PMOS second transistor M2 turn on when the following condition satisfies:

$$(V+) > (V-) + V_{tn} + |V_{tp}|$$

where $V_{tn}$ is the threshold voltage of the NMOS first transistor M1, and $V_{tp}$ is the threshold voltage of the PMOS second transistor M2. In other words, the first predetermined value is equal to the sum of $V_{tn}$ and the absolute value of $V_{tp}$.

Regarding the second branch, the NMOS third transistor M3 and the PMOS fourth transistor M4 turn on when the following condition satisfies:

$$(V-) > (V+) + V_{tn} + |V_{tp}|$$

where $V_{tn}$ is the threshold voltage of the NMOS third transistor M3, and $V_{tp}$ is the threshold voltage of the PMOS fourth transistor M4. In other words, the second predetermined value is equal to the sum of $V_{tn}$ and the absolute value of $V_{tp}$.

The current mirror circuit 14 includes two same-type MOS transistors: a first MOS transistor M5 and a second MOS transistor M6 (e.g., both NMOS transistors as shown in FIG. 2) with the current flowing direction being the same as that of the current source 10. The first MOS transistor M5 is diode-connected, and the gates of the first and second MOS transistors M5 and M6 are coupled together. The first MOS transistor M5 is electrically coupled to the switch circuit 12, specifically the drains of the PMOS second transistor M2 and the PMOS fourth transistor M4; the second MOS transistor M6 is electrically coupled to the amplifier 2, specifically the differential pair 20. According to FIG. 2, in addition to the current source 24, the second MOS transistor M6 may adaptively provide an additional current, i.e., the mirrored current, for the differential pair 20. Therefore, the slew rate of the amplifier 2 may be improved without degrading its stability.

Figure 3:
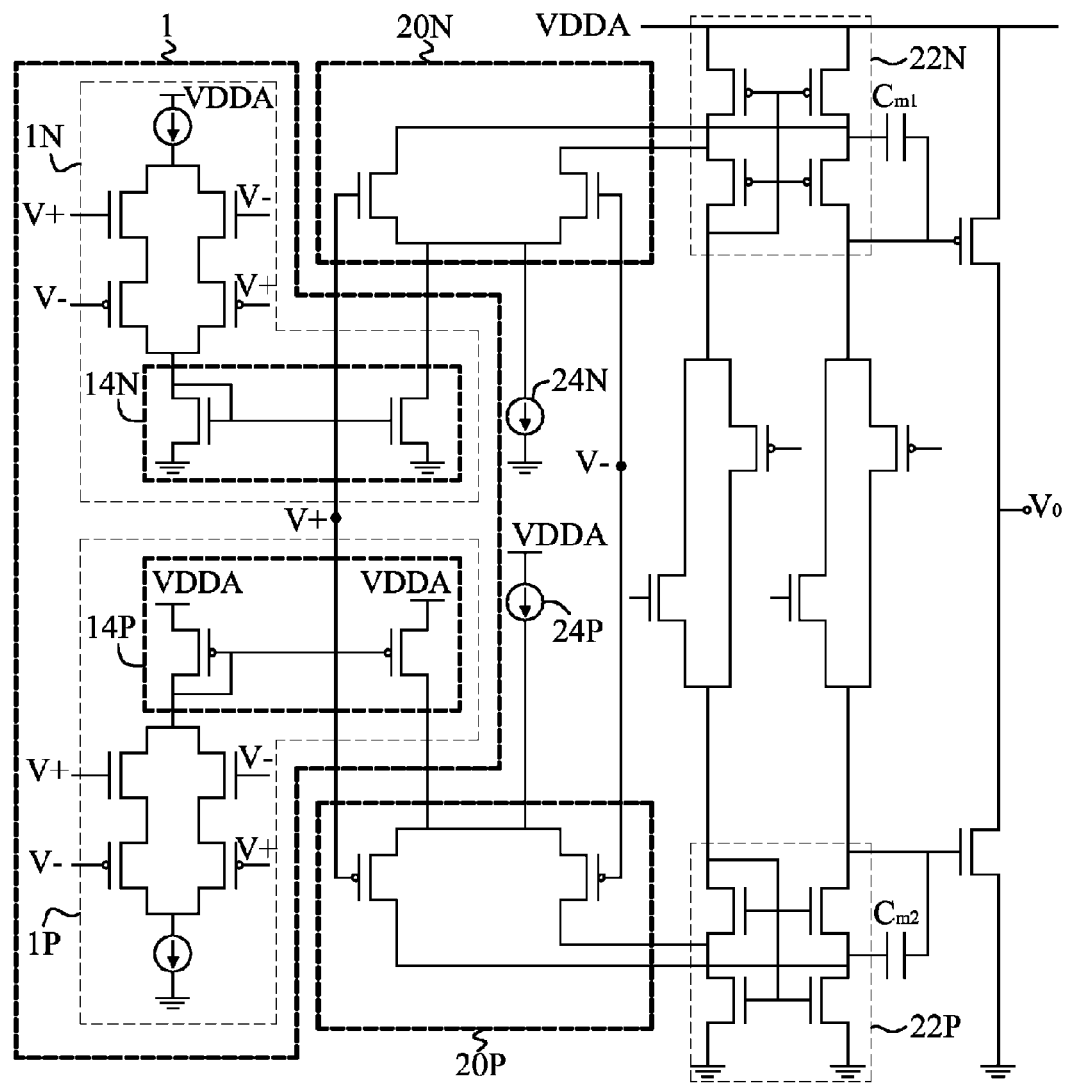
FIG. 3 shows another detailed circuit of the slew rate enhancing circuit of FIG. 1 according to the embodiment of the present invention.

FIG. 3 shows another detailed circuit of the slew rate enhancing circuit 1 of FIG. 1 according to the embodiment of the present invention. The slew rate enhancing circuit 1 is used, in the present embodiment, to increase the slew rate of a rail-to-rail operational amplifier as shown. The slew rate enhancing circuit 1 of FIG. 3 is similar to the slew rate enhancing circuit 1 of FIG. 2, with the exception that the slew rate enhancing circuit 1 of FIG. 3 includes two slew rate enhancing circuits: an N-type slew rate enhancing circuit 1N and a P-type slew rate enhancing circuit 1P. The N-type slew rate enhancing circuit 1N uses an N-type current mirror circuit 14N (i.e., both the first and second MOS transistors M5 and M6 as illustrated in FIG. 2 are N type) to provide the mirrored current for an N-type differential pair 20N, and the P-type slew rate enhancing circuit 1P uses a P-type current mirror circuit 14P (i.e., both the first and second MOS transistors M5 and M6 as illustrated in FIG. 2 are P type) to provide the mirrored current for a P-type differential pair 20P.

The N-type differential pair 20N of the rail-to-rail operational amplifier has a corresponding active current load 22N, and the P-type differential pair 20P has a corresponding active current load 22P. The capacitors denoted as $C_{m1}$ and $C_{m2}$ are Miller capacitors. According to FIG. 3, in addition to the current sources 24N and 24P, the N-type current mirror circuit 14N and the P-type current mirror circuit 14P may adaptively provide additional currents, i.e., the mirrored currents, for the N-type differential pair 20N and the P-type differential pair 20P, respectively. Accordingly, the slew rate of the rail-to-rail operational amplifier may be improved without degrading its stability.

Although specific embodiments have been illustrated and described, it will be appreciated by those skilled in the art that various modifications may be made without departing from the scope of the present invention, which is intended to be limited solely by the appended claims.

What is claimed is:

1. A slew rate enhancing circuit, comprising:
   a current source configured to source or sink a current;
   a current mirror circuit configured to generate a mirrored current according to the current source, the mirrored current being adaptively provided for an amplifier that is coupled to receive a non-inverting input voltage and an inverting input voltage; and
   a switch circuit electrically coupled with the current source and the current mirror circuit, the switch circuit including a first branch and a second branch that are coupled in parallel, wherein passage of the first branch and passage of the second branch are respectively controlled by a first switch and a second switch according to the non-inverting input voltage and the inverting input voltage;
   wherein the first switch is closed when a voltage difference between the non-inverting input voltage and the inverting input voltage is greater than a first predetermined value, and the second switch is closed when a reverse voltage difference between the non-inverting input voltage and the inverting input voltage is greater than a second predetermined value.

2. The slew rate enhancing circuit of claim 1, wherein the amplifier comprises at least one differential pair, which is electrically coupled to receive the non-inverting input voltage and the inverting input voltage.

3. The slew rate enhancing circuit of claim 2, wherein the current mirror circuit is electrically coupled with the differential pair, and provides the mirrored current for the differential pair.

4. The slew rate enhancing circuit of claim 2, wherein the amplifier is an operational amplifier.

5. The slew rate enhancing circuit of claim 1, wherein the switch circuit is electrically coupled between the current source and the current mirror circuit.

6. The slew rate enhancing circuit of claim 5, wherein the first branch comprises an N-type metal-oxide-semiconductor (NMOS) first transistor and a P-type metal-oxide-semiconductor (PMOS) second transistor that are connected in series, and the second branch comprises an NMOS third transistor and a PMOS fourth transistor that are connected in series.

7. The slew rate enhancing circuit of claim 6, wherein a source of the NMOS first transistor is connected to a source of the PMOS second transistor, a drain of the NMOS first transistor is connected to the current source; a drain of the PMOS second transistor is connected to the current mirror circuit; a gate of the NMOS first transistor is coupled to receive the non-inverting input voltage; and a gate of the PMOS second transistor is coupled to receive the inverting input voltage.

8. The slew rate enhancing circuit of claim 7, wherein a source of the NMOS third transistor is connected to a source of the PMOS fourth transistor; a drain of the NMOS third transistor is connected to the current source; a drain of the PMOS fourth transistor is connected to the current mirror circuit; a gate of the NMOS third transistor is coupled to receive the inverting input voltage; and a gate of the PMOS fourth transistor is coupled to receive the non-inverting input voltage.

9. The slew rate enhancing circuit of claim 7, wherein the NMOS first transistor and the PMOS second transistor turn on when following condition satisfies:

$$(V+) > (V-) + V_{tn} + |V_{tp}|,$$

wherein V+ is the non-inverting input voltage, V− is the inverting input voltage, $V_{tn}$ is a threshold voltage of the NMOS first transistor, and $V_{tp}$ is a threshold voltage of the PMOS second transistor.

10. The slew rate enhancing circuit of claim 8, wherein the NMOS third transistor and the PMOS fourth transistor turn on when following condition satisfies:

$$(V-) > (V+) + V_{tn} + |V_{tp}|,$$

wherein V+ is the non-inverting input voltage, V− is the inverting input voltage, $V_{tn}$ is a threshold voltage of the NMOS third transistor, and $V_{tp}$ is a threshold voltage of the PMOS fourth transistor.

11. The slew rate enhancing circuit of claim 2, wherein the current mirror circuit comprises a first MOS transistor and a second MOS transistor, each having a current flowing direction being the same as that of the current source.

12. The slew rate enhancing circuit of claim 11, wherein the first MOS transistor is diode-connected; a gate of the first MOS transistor is coupled to a gate of the second MOS transistor; the first MOS transistor is electrically coupled to the switch circuit; and the second MOS transistor is electrically coupled to the differential pair.

13. The slew rate enhancing circuit of claim 12, wherein the differential pair and the current mirror circuit are N type.

14. The slew rate enhancing circuit of claim 12, wherein the differential pair and the current mirror circuit are P type.

\* \* \* \* \*